United States Patent
Spitzner et al.

(10) Patent No.: US 10,973,114 B2
(45) Date of Patent: Apr. 6, 2021

(54) INDIUM-BASED INTERFACE STRUCTURES, APPARATUS, AND METHODS FOR FORMING THE SAME

(71) Applicant: L3 Technologies, Inc., New York, NY (US)

(72) Inventors: Matthew J. Spitzner, Lowry Crossing, TX (US); Fernando Ortiz, Dallas, TX (US)

(73) Assignee: L3 Technologies, Inc., New York, NY (US)

( * ) Notice: Subject to any disclaimer, the term of this patent is extended or adjusted under 35 U.S.C. 154(b) by 0 days.

(21) Appl. No.: 16/173,523

(22) Filed: Oct. 29, 2018

(65) Prior Publication Data
US 2020/0137876 A1 Apr. 30, 2020

(51) Int. Cl.
*H05K 3/34* (2006.01)
*H05K 1/02* (2006.01)
*H05K 7/20* (2006.01)

(52) U.S. Cl.
CPC ......... *H05K 1/0209* (2013.01); *H05K 3/3463* (2013.01); *H05K 7/20481* (2013.01)

(58) Field of Classification Search
None
See application file for complete search history.

(56) References Cited

U.S. PATENT DOCUMENTS

| | | | | | |
|---|---|---|---|---|---|
| 5,396,403 | A * | 3/1995 | Patel | ..................... | H01L 23/433 257/713 |
| 5,786,635 | A * | 7/1998 | Alcoe | ..................... | H01L 21/563 257/718 |
| 6,275,381 | B1 * | 8/2001 | Edwards | ............ | H05K 7/20454 165/185 |
| 6,773,963 | B2 * | 8/2004 | Houle | ................. | H01L 23/3128 257/707 |
| 7,362,580 | B2 * | 4/2008 | Hua | ........................ | H01L 23/10 257/E23.09 |
| 7,663,242 | B2 * | 2/2010 | Lewis | ................. | H01L 23/3735 257/705 |
| 7,898,076 | B2 * | 3/2011 | Furman | ................... | H01L 23/42 257/706 |
| 8,582,297 | B2 * | 11/2013 | Edwards | ................ | F28F 13/00 361/705 |

(Continued)

OTHER PUBLICATIONS

Indium Corporation, "5RMA-RC and 5RA-RC Reach Compliant Liquid Fluxes", Product Data Sheet, 2015, 1 pg.

(Continued)

*Primary Examiner* — Devang R Patel

(74) *Attorney, Agent, or Firm* — Egan, Enders & Huston LLP.

(57) ABSTRACT

Indium-based interface systems, structures, and methods for forming the same are provided. The disclosed indium-based interfaces may be formed as solid structures between two solid surfaces by providing a solid indium-based material between the two surfaces, and heating the indium-based material above its melting point while in contact with each of the two surfaces to cause the indium-based material to reflow or otherwise liquefy between the two surfaces. The indium-based material may then be cooled below its melting point to form a solid interface material structure that is positioned between and in contact with each of the surfaces.

8 Claims, 14 Drawing Sheets

(56) References Cited

U.S. PATENT DOCUMENTS

| | | | | |
|---|---|---|---|---|
| 2003/0203181 A1* | 10/2003 | Ellsworth, Jr. | ....... | H01L 23/367 428/307.3 |
| 2012/0075807 A1* | 3/2012 | Refai-Ahmed | ......... | H01L 23/13 361/719 |
| 2013/0224510 A1* | 8/2013 | Deng | ...................... | H01L 23/42 428/576 |
| 2014/0002989 A1* | 1/2014 | Ahuja | ....................... | G06F 1/20 361/679.54 |
| 2016/0247742 A1* | 8/2016 | Vadhavkar | ............ | H01L 23/367 |
| 2017/0374759 A1* | 12/2017 | Hoffmeyer | ................ | G06F 1/20 |

OTHER PUBLICATIONS

Fujipoly, "Sarcon XR-M, New Product", Jul. 14, 2009, 2 pgs.
Indium Corporation, "Heatsink Mounting Using Heat Spring TIM", Jun. 2009, 4 pgs.
Indium Corporation, "Heat Spring", Printed From Internet Apr. 7, 2018, 3 pgs.
Indium Corporation, News Releases, "Indium Corporation Features Heat Spring for IGBT Assembly at PCIM", Apr. 2015, 2 pgs.
Indium Corporation, News Releases, "Indium Corporation Introduces Thermal Interface Material for IGBT Modules", Sep. 2009, 2 pgs.
Indium Corporation, "Thermal Interface Materials (TIM)", Product Data Sheet, 2016, 1 pg.
Indium Corporation, "Thermal Management", Printed From Internet on Mar. 31, 2018, 2 pgs.
Wikipedia, "Thermal Conductivity Measurement", Printed From Internet Sep. 6, 2018, 9 pgs.
Wikipedia, "Thermal Interface Material", Printed From Internet Apr. 27, 2018, 1 pg.
Indium Corporation, "Thermal Management Using Indium Metal: The Heat Spring", Feb. 2016, 4 pgs.
Sorgo, "Understanding Phase Change Materials", Electronics Cooling, May 2002, 8 pgs.
Indium Corporation, "Use of Heat Spring Material", 2008, 1 pg.
Roy et al., "Application of Low Melt Alloys As Compliant Thermal Interface Materials: A Study of Performance and Degradation Under thermal Duress", Electronics Cooling, Jun. 2015, 6 pgs.

\* cited by examiner

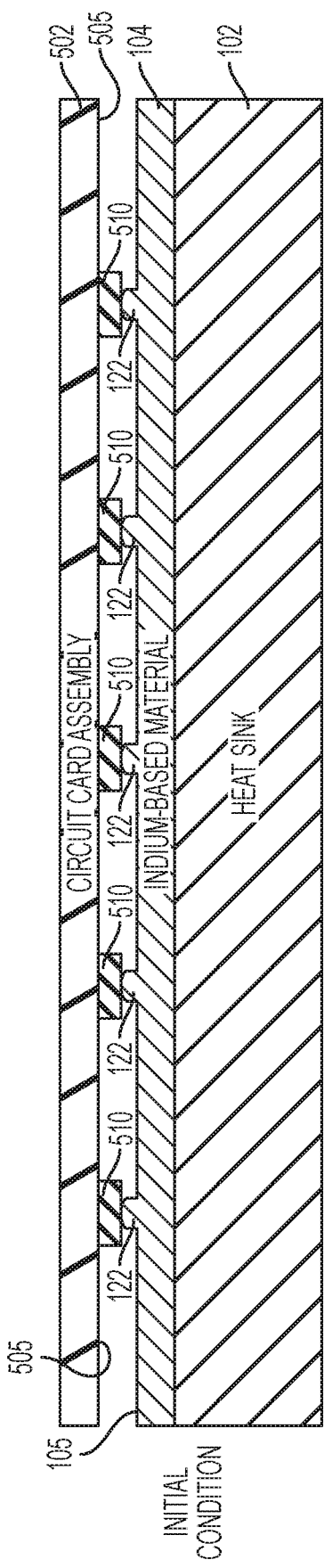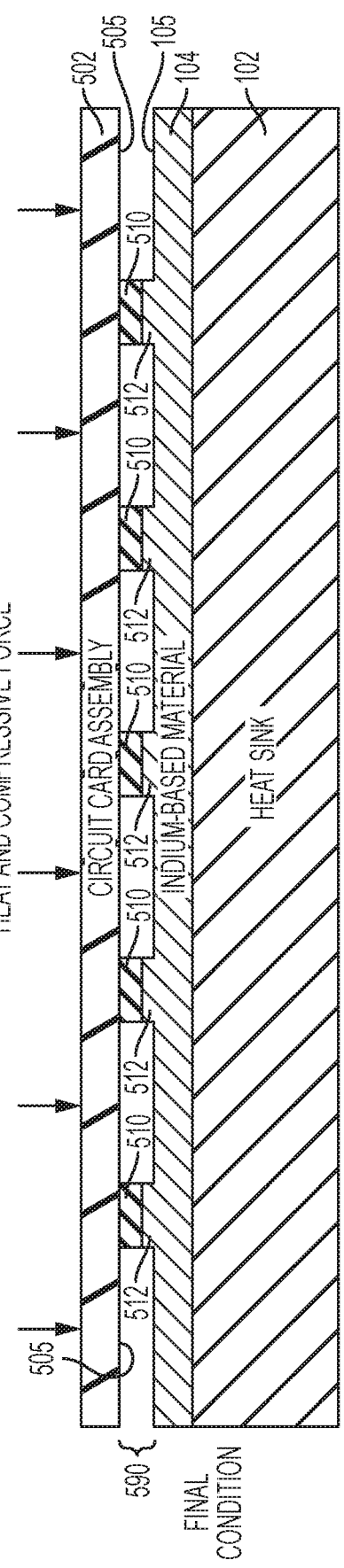

INDIUM-BASED INTERFACE STRUCTURES, APPARATUS, AND METHODS FOR FORMING THE SAME

FIELD

The present invention relates to interfaces, and more particularly to interfaces formed between separate surfaces.

BACKGROUND

Heat sinks are employed to cool heat-emitting components such as high power amplifiers, and a variety of conventional heatsink technologies are available to provide heat removal or heat dissipation at the system level. Thermal interface materials (TIMs) are used between a heat-emitting component and a heat sink to enhance thermal coupling between the component and the heat sink. Examples of conventional TIMs include compliant TIMs having thermal conductivity in the 3-6 watts per meter-kelvin (W/m-K) range, and a silicone gel sheet TIM material that requires very high contact pressures (i.e., greater than 100 psi) to achieve a thermal conductivity of 17 W/m-K.

SUMMARY

Disclosed herein are indium-based interface structures, apparatus, and methods for forming the same. In one embodiment, the disclosed indium-based interfaces may be formed as a solid structures between two solid surfaces by providing a solid indium-based material between the two surfaces, and heating the indium-based material above its melting point while in contact with each of the two surfaces to cause the indium-based material to reflow or otherwise liquefy between the two surfaces. The indium-based material may then be cooled below its melting point to form a solid interface material structure that is positioned between and in contact with each of the surfaces. Examples of materials that may be employed to form the disclosed interfaces include indium and alloys of indium, e.g., Indium silver alloys such as 97 In 3 Ag, and other indium alloys with silver, tin, bismuth, lead, and gallium etc. that have a thermal conductivity greater than conventional TIMs.

In one embodiment, indium-based interface materials may be selected to have a melting point above anticipated operating temperature of the completed assembly or device (so that the indium-based interface material remains solid at operating temperatures) but below the melting point of solder present in adjacent components (so that the electronic parts don't de-solder during indium-based material installation). For example, indium-based interface materials may be selected in one embodiment to have a melting point below the 182° C. melting point of eutectic tin-lead solder and greater than or equal to 125° C., a typical maximum operating temperature of an electrical component requiring TIM. In such an embodiment, indium-based interfaces may be advantageously formed without causing solder reflow or other damage to adjacent soldered components that are also exposed to temperature conditions of the indium-based interface-forming process, e.g., by using a maximum processing temperature of from 125° C. to less than 182° C., alternatively using a maximum processing temperature of from 158° C. (i.e., melting point of pure Indium) to less than 182° C., alternatively using a maximum processing temperature of greater than 158° C. to less than 182° C., alternatively using a maximum processing temperature of from 160° C. to less than 180° C.

However, it will be understood that the above ranges are exemplary only, and that particular processing temperatures may vary higher or lower in other embodiments according to the melting point temperature of the particular indium-based material employed, the melting point of solder present in the adjacent components, and/or other temperature sensitive materials in adjacent components. In this regard, other higher or lower process temperatures may be employed in other embodiments to melt indium-based materials, e.g., including higher process temperatures where the joined components include only non-electronic components or otherwise non-heat sensitive components. Further, indium-based interface materials may be selected to have a melting point up to the melting point of lead-free (non-lead) solder present in adjacent components (e.g., up to but less than temperatures corresponding to non-lead solder melting points as high as from 200° C. to 230° C.). For example, indium-based interface materials may be selected in one such embodiment to have a melting point greater than or equal to 125° C. to less than 230° C., and corresponding maximum processing temperature accordingly selected to be from 125° C. to less than 230° C. such that the indium-based interface material remains solid at assembly or device operating temperatures while the electronic parts of the assembly or device don't de-solder during indium-based material installation.

In one embodiment, the indium-based material may wet to each of the adjacent solid surfaces when melted or reflowed, so as to conform to the geometry of the sold surfaces and result in a solid indium-based interface that makes intimate contact with the shape and/or geometry of the mating surfaces including confirming to any variations or irregularities in the shape of the solid surfaces. In one embodiment, each of the solid surfaces may be metal, and the melted indium-based material may form a highly conformable metal-to-metal joint with each metal surface that efficiently conducts heat. Heating and melting of an indium-based interface material may be performed in a single step in which the indium-based material is liquefied and simultaneously wetted between two solid surfaces in a single step, or may be performed in multiple steps, e.g., such as by melting and wetting the indium-based material to one of two surfaces in a first heating step followed by cooling and then reflowing and wetting the indium-based material to the other one of the surfaces in a second heating step. In one exemplary embodiment, the indium-based interface material may wet and mechanically adhere to each of the two surfaces during the cooling step without the presence of any adhesive or other chemical bonding. In such an embodiment, this mechanical adherence may advantageously hold the indium-based interface material together with the mating surfaces without the need for any permanent external clamping force or other externally applied compressive force.

In one exemplary embodiment, an indium-based material employed to form a thermal interface material (TIM) disposed in a gap existing between the surface of a heat-emitting (e.g., heat source) component and the surface of a heat sink component. One example of such an application is an indium-based TIM formed between surfaces of high power dissipation components and surfaces of their heatsink components in complex electronic assemblies. In such an embodiment, the indium-based material may be processed in a liquid state between the component surfaces before being solidified so as to overcome tolerance stackups, make intimate thermal contact between the separate (e.g., two) surfaces, and to provide a stable thermal path over a range of operational temperatures and environments. The indium-based materials may be so employed to form a TIM that is positioned between (and in contact with) two surfaces that are spaced apart by the TIM, e.g., between a surface of a heat-emitting component (e.g., such as a power amplifier, processor, transistor, resistor, field-programmable gate array (FPGA), regulator, etc.) and a surface of a heat-dissipating component (e.g., such as a heat sink).

In one exemplary embodiment an indium-based TIM may form a non-soldered thermally conductive contact with each of the two surfaces between which the TIM is disposed. In one exemplary embodiment, the disclosed indium-based interfaces may be utilized as TIM structures to complete a thermal chain between high heat load, high heat flux heat-emitting components (e.g., such as high power amplifiers) and separate heat sink components so as to cool or otherwise provide system level heat removal or heat dissipation between such components, e.g., for high power systems such as systems having power densities of greater than or equal to 10 Watts/centimeter, alternatively from 10 Watts/centimeter to 50 Watts/centimeter, alternatively of greater than or equal to 50 Watts/centimeter.

In one embodiment, the disclosed indium-based TIM configurations may be implemented to provide greater thermal conductance, better cooling and reduced component operating temperatures as compared to conventional thermal interface materials, which leads to a lower temperature rise between a heat-emitting component and a heat sink component. In a further embodiment, the disclosed indium-based TIM configurations may be so implemented without the extra size, weight, complexity and cost otherwise required to improve heat sink performance to overcome the extra temperature rise that would otherwise exist in a conventional thermal interface material configuration. The disclosed indium-based TIM configurations may thus be implemented to provide enhanced cooling performance compared to conventional thermal interface configurations, and at the same time may be formed in one embodiment using a repeatable process without adding size, weight or complexity to the overall component/heat sink system.

In one embodiment, an indium-based TIM may have a thermal conductivity that is selected to be high enough to maintain acceptable part temperatures, given the temperature limits and heat flux conditions of a given application. Advantageously, an indium-based material may be assembled, heated and adhered to make good thermally conductive contact (e.g., in one embodiment to achieve bulk linear thermal conductivity of greater than or equal to 16 watts per meter-kelvin (W/m-K) or other ranges of bulk linear thermal conductivity described in the below paragraph) with mating heat sink and heat-emitting component surfaces by applying a minimal temporary compressive or clamping force (e.g., in one embodiment no greater than 10 psi, alternatively no greater than 5 psi, alternatively from 1 psi to 5 psi, alternatively from 1 psi to 10 psi, or other suitable greater or lesser compressive force) that may then be released after assembly and cooling of the assembled indium-based TIM with the heat sink and heat-emitting components, and without the need for maintaining a much higher and permanent 40 psi to 60 psi compressive force that is typically required to hold conventional thermal interface materials pressed together in sufficient thermal contact with mating heat sink and electronic components in a completed assembly. This reduced compressive force minimizes the potential for damage that may occur to delicate components that are mated with conventional thermal interface assemblies.

For example, in one embodiment, an indium-based TIM having a bulk linear thermal conductivity of greater than or equal to 16 watts per meter-kelvin (W/m-K) may be employed where operating heat flux conditions are relatively high due to the amount of heat per unit time that must be transferred from the heat-emitting component to maintain the temperature of the heat-emitting component at or below its maximum operating temperature, and the surface area (or cross-sectional flow area) across which this heat must be transferred. In one embodiment, substantially pure indium metal having a bulk thermal conductivity of 86 W/m-K may be employed as a TIM. In one embodiment, a completed indium-based TIM may have an effective bulk linear thermal conductivity greater than or equal to 16 W/m-K, alternatively from 16 W/m-K to 86 W/m-K, and further alternatively from 29 W/m-K to 49 W/m-K. In such embodiments, thermal conductivity of the TIM is sufficient to handle relatively high heat flux conditions, e.g., for high power electronic components. In one embodiment, these values of bulk thermal conductivity may be achieved with the application of the ranges of minimal temporary compressive or clamping force described above in the previous paragraph.

Values of effective bulk linear thermal conductivity acknowledge any failure to get 100% indium-based material interface coverage between components during the assembly process, e.g., due to process variation and tolerance stackup. Effective bulk linear thermal conductivity is calculated from measured thermal rise between assembled heat-emitting and heat sink components on the assumption that 100% interface coverage between the components has been achieved during component assembly. Thus, for a substantially pure indium metal TIM with less than 100% interface coverage between heat-emitting and heat sink components, an effective bulk linear thermal conductivity that is below the bulk linear thermal conductivity of a pure indium interface is calculated. Nonetheless, in this example the calculated effective bulk linear thermal conductivity for the indium metal material interface is greater than the effective bulk linear thermal conductivity of conventional TIMs formed between the same heat-emitting and heat sink components, while at the same time using a lower process clamping force than conventional TIM formation processes and without using any after-process retaining clamping force such as is required by conventional TIM formation processes.

In some embodiments, multiple different heat-generating component parts (e.g., multiple power amplifier components, processors, transistors, resistors, FPGAs, regulators, etc.) may be provided on a common circuit board, and mounted together to a common heat sink component with an indium-based TIM structure positioned between and separating the heat sink component and heat-emitting components. In some embodiments, the heat-emitting component parts that require heat transfer across the TIM may be numerous and have a relatively large combined surface area (e.g., greater than or equal to 10 square inches in one embodiment) which in some instances may lead to concerns about excessive compressive pressure during installation. Additionally, the numerous heat-emitting components may optionally have different areal dimensions and/or be of different thickness from each other, leading to varying assembled gap thicknesses between the different heat-emitting components and the heat sink component/s. In such cases, the disclosed indium-based interface materials may be selected to be highly compliant (e.g., so as to be processed and manipulated in its liquid state) during reflow in order to overcome the variation in gap thickness between the heat-emitting components and heat sink component/s, as well as to as well as to minimize the contact resistance during component assembly. In this regard, an indium-based material (e.g., such as indium-based foil) may be processed in the liquid state to assure that the gap/s between components are filled, and that the thermal contact resistance between the components remains low (e.g., at or below 0.05° C.-inch$^2$/Watt in one embodiment) during assembly, i.e., since in its liquid state the indium-based material wets well to the component surfaces well and fills any small voids or other irregularities existing in the space between the assembled components.

An indium-based interface may be formed in any suitable manner in which the indium-based material is positioned between two component surfaces, melted to a liquid state, and then solidified. For example, in one exemplary embodiment, an indium-based TIM may be formed between surfaces of two assembled components by positioning a solid planar indium-based foil between the two surfaces, heating the assembled components to cause the indium-based material to at least partially flow between the surfaces, and then allowing the indium-based material to solidify in place between (and in contact with) the assembled surfaces.

In another exemplary embodiment, at least one mating surface of an indium-based material may be shaped to match the layout (e.g., pattern and/or components sizes) of multiple mating component surfaces prior to heating and reflow. Such an embodiment may be advantageous, for example, when forming a TIM between a heat sink surface and individual backside surfaces of multiple different spaced-apart electronic part components that are mounted to a common substrate such as a printed circuit board (PCB) in order to pull heat directly off the backside of the electronic components. A mating TIM surface may be shaped to match a layout of such electronic components in any suitable manner, but in one embodiment may be pre-patterned with bumps (e.g., using a patterned mandrel) during a first melting step performed before assembling the resulting patterned surface of the TIM to the layout of multiple mating component surfaces and performing a second melting or reflow step. Such an embodiment may be performed, for example, to control (e.g., help contain or reduce) spillage of any excess electrically-conductive liquid metal indium outward from the individual mating electronic components during the second reflow step, thus preventing electrical shorts between the multiple electronic components. In one embodiment, the individual mating electronic components may be flip chip components having a low temperature rise, the back side of which are mated to a heat sink via an indium-based TIM as described herein. In such an embodiment, heat may be pulled directly off the back side of the flip chip components, making possible increased performance and reduced packaging size.

In one respect, disclosed herein is a method, including forming a solid indium-based interface between a first surface and a second surface by: positioning the indium-based material in contact with a first surface while heating the indium-based material above the melting point of the indium-based material and then maintaining the indium-based material in contact with the first surface while allowing the indium-based material to cool below the melting point of the indium-based material; and positioning the indium-based material in contact with a second surface while heating the indium-based material above the melting point of the indium-based material and then maintaining the indium-based material in contact with the second surface while allowing the indium-based material to cool below the melting point of the indium-based material. And, in another respect, disclosed herein is an apparatus including a first surface, a second surface, and a solid indium-based interface formed between the first surface and the second surface by the above method.

In another respect, disclosed herein is an apparatus including a first surface, a second surface, and a solid indium-based interface melted between and adhered to the first surface and the second surface.

BRIEF DESCRIPTION OF THE DRAWINGS

FIG. 5B illustrates a front cross-sectional view of a circuit card assembly, heat sink, and indium-based material according to one exemplary embodiment of the disclosed structures, apparatus and methods.

FIG. 5C illustrates a front cross-sectional view of a circuit card assembly, heat sink, and indium-based material according to one exemplary embodiment of the disclosed structures, apparatus and methods.

DESCRIPTION OF ILLUSTRATIVE EMBODIMENTS

Figure 1:
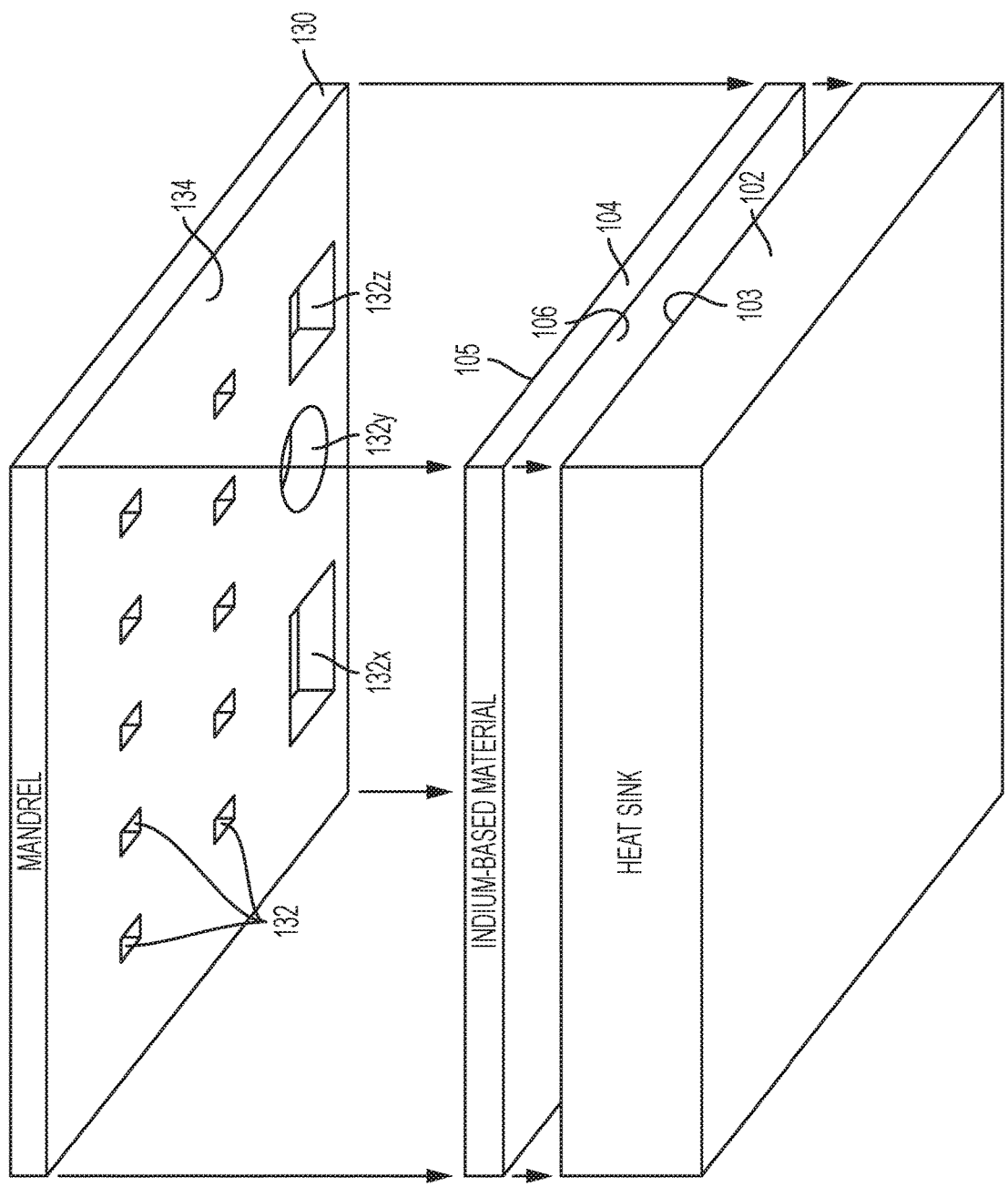
FIG. 1 illustrates an underneath perspective view of a mandrel, heat sink, and indium-based material according to one exemplary embodiment of the disclosed structures, apparatus and methods.

FIG. 1 illustrates an underneath perspective view of one exemplary embodiment of a mandrel 130 having a planar lower surface 134 may be aligned and brought together in the directions of the arrows with the planar upper surface 103 of a heat sink 102 around an indium-based material (in this case indium foil) 104 that is positioned as a preform therebetween. It will be understood that besides pure indium foil, an indium-based material may be an alloy of indium with other materials (e.g., other metals such as described elsewhere herein) and/or may be other forms of indium-based material besides foil, e.g., such as bulk (ingots or shot), etc. In one embodiment, thickness of an indium-based material 104 such as indium-based foil may be selected to fit the characteristics of a given application, e.g., from 0.005 inch to 0.030 inch thick, and alternatively 0.010 inch thick. However, it will be understood that in other embodiments thickness of an indium-based material may greater than 0.005 inch thick or may be less than 0.030 inch thick.

Figure 2:
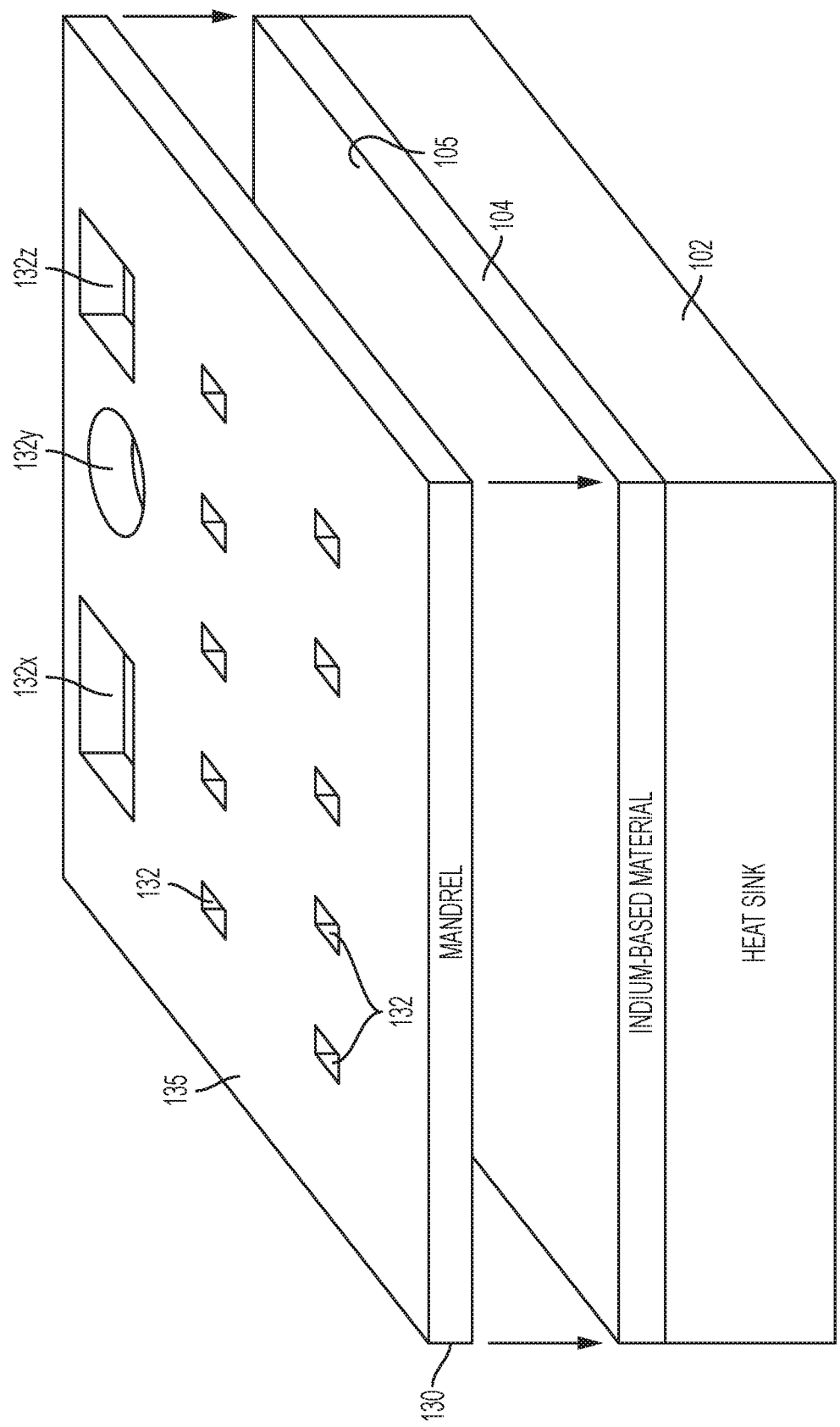
FIG. 2 illustrates an overhead perspective view of a mandrel, heat sink, and indium-based material according to one exemplary embodiment of the disclosed structures, apparatus and methods.

As shown in FIG. 1, mandrel 130 of this embodiment is configured as a flat plate that includes multiple openings (e.g., holes) 132 defined within the planar lower surface 134 of mandrel 130 to provide spaces for forming indium-based material bumps 122 as described further herein. Openings 132 may extend entirely from lower surface 134 of mandrel 130 through mandrel 130 to the upper surface 135 of mandrel 130 as shown in FIG. 2, or may alternatively not extend all the way through mandrel 130 so as to be closed in by a solid upper surface 135 of mandrel 130 as shown for example in FIG. 3A. Openings 132 may be shaped, sized, spaced and oriented to match a desired thermal contact pattern, e.g., a regular or irregular pattern which may correspond to a layout and/or shape of individual electronic parts to be later assembled to the heat sink 102, a regular or irregular pattern which may correspond to layout and/or shape of particular heat-emitting areas of an electronic part to be assembled to the heat sink, etc. Mandrel 130 may be composed of any material (e.g., such as aluminum, stainless steel, or high melting temp plastics, etc.) having suitable hardness and sufficiently high melting point to withstand the temperature and compressive force process conditions described further herein. Heat sink 103 may be composed of any material (e.g., such as copper, brass, aluminum, etc.) having suitable heat transfer characteristics to fit a given application, together with suitable hardness and sufficiently high melting point to withstand the temperature and compressive force process conditions described further herein.

FIG. 2 illustrates an overhead perspective view of the mandrel 130, heat sink 102 and intervening indium-based material 104 of FIG. 1. As shown in the embodiment of FIG. 2, lower surface 106 of indium-based material 104 has been placed on the upper surface 103 of heat sink 102 which is held in fixed position while the lower surface 134 of mandrel 130 is being brought downward and together with the exposed planar upper surface 105 of indium-based material 104 in the directions of the arrows until the mandrel 130 contacts indium-based material 104 and compresses indium-based material 104 between mandrel 130 and heat sink 102 as shown by the arrows in FIG. 3A, and in one embodiment such that the lower surface 106 of indium-based material 104 may be adhered to upper surface 103 of heat sink 102 only by virtue of process heating as described further below and without application of any separate adhesive between surfaces 106 and 103. An optional mold release agent (e.g., such as Bonderite Casting Lubricant available from Henkel AG & Company, KGaA, of Dusseldorf, Germany) may be applied to the lower surface 134 of mandrel 130 and inner surfaces of mandrel openings 132 prior to bringing lower surface 134 of mandrel 130 into contact with upper surface 105 of indium-based material 104.

It will be understood that the particular up and down orientation of mandrel 130, heat sink 102 and indium-based material 104 shown in the Figures is illustrative only, and that it is possible that assembly of mandrel 130 and heat sink 102 around intervening indium-based material 104 may be performed with these components oriented in any other way, e.g., such as with heat sink 102 positioned above mandrel 130 with indium-based material 104 therebetween. Moreover, it is possible in other embodiments that mandrel 130 may alternatively be held in fixed position while heat sink 102 is brought together with mandrel 130 to compress indium-based material 104 therebetween, or both mandrel 103 and heat sink 102 may alternatively be moved toward each other to compress indium-based material 104 there between.

Figure 3A:
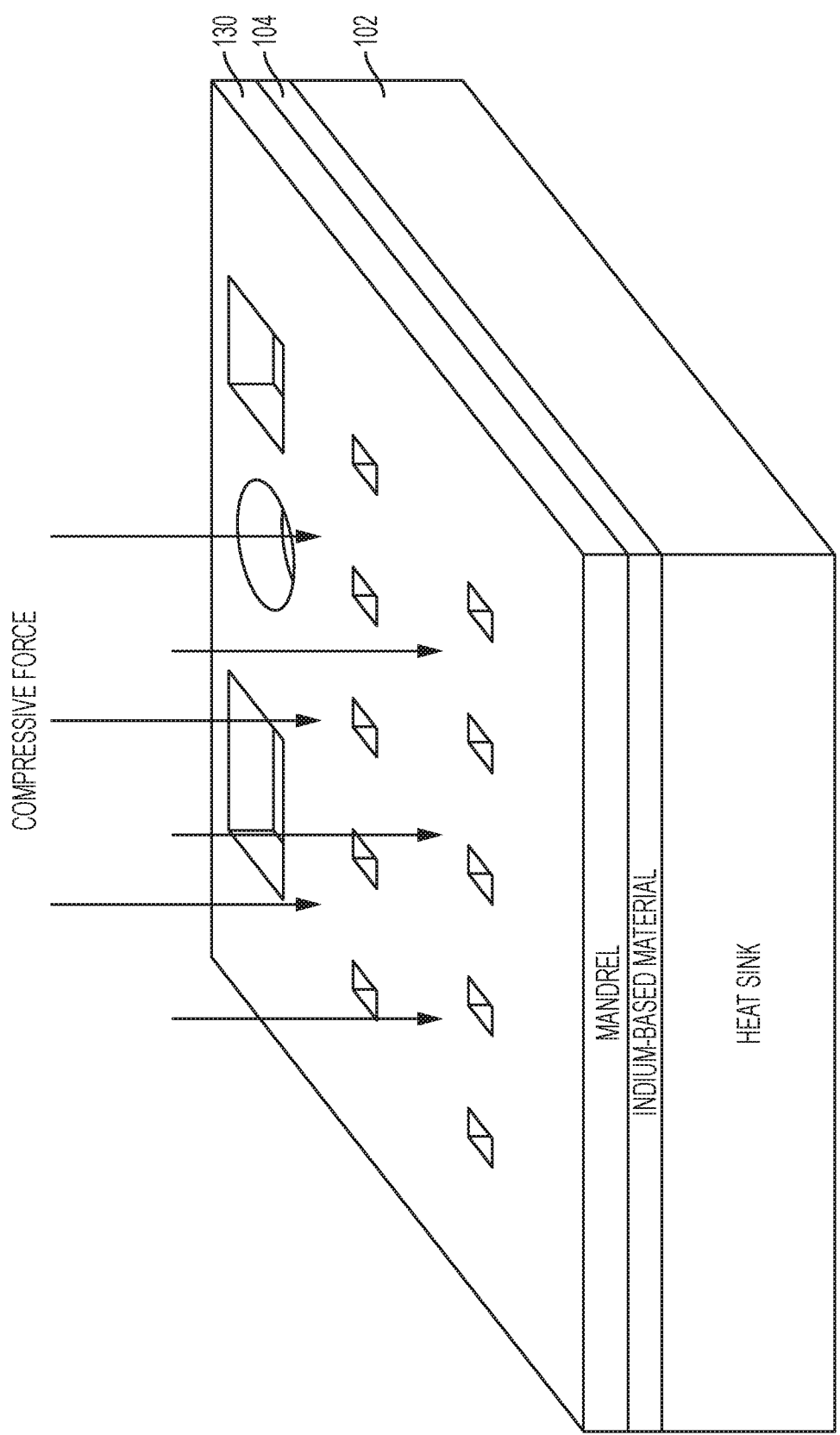
FIG. 3A illustrates an overhead perspective view of a mandrel, heat sink, and indium-based material according to one exemplary embodiment of the disclosed structures, apparatus and methods.
Figure 3B:
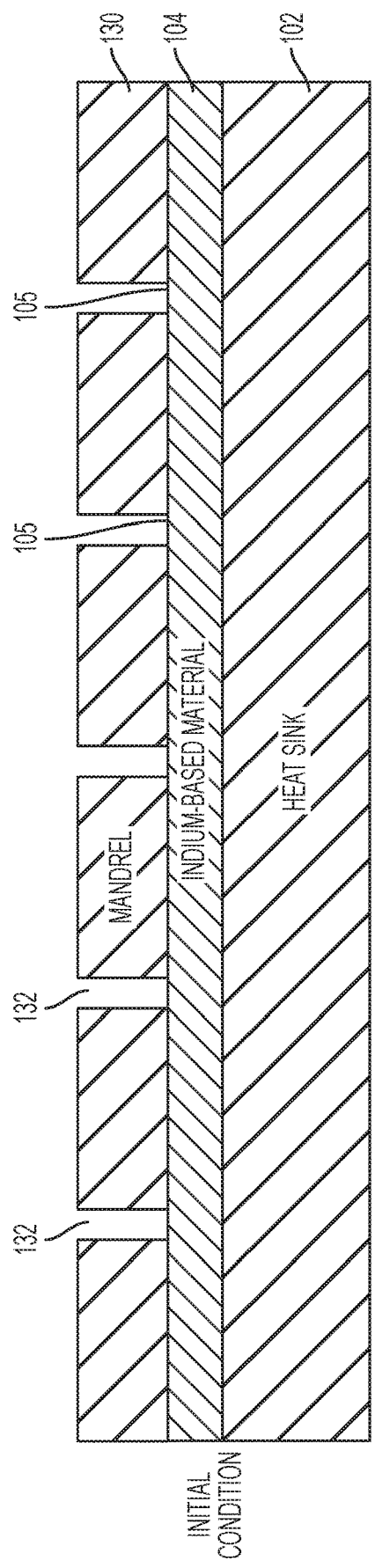
FIG. 3B illustrates a front cross-sectional view of a mandrel, heat sink, and indium-based material according to one exemplary embodiment of the disclosed structures, apparatus and methods.
Figure 3C:
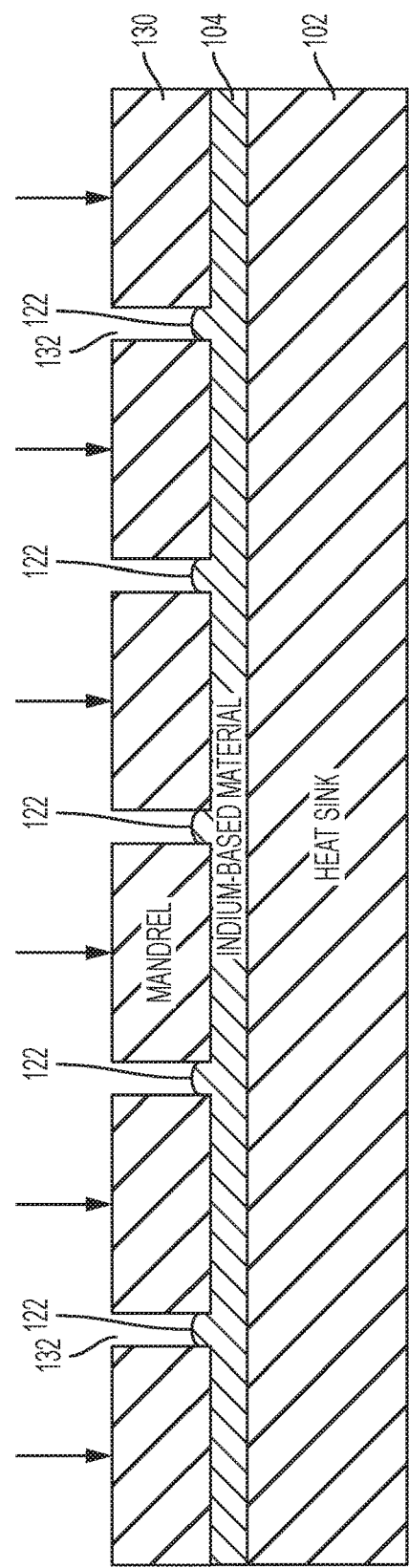
FIG. 3C illustrates a front cross-sectional view of a mandrel, heat sink, and indium-based material according to one exemplary embodiment of the disclosed structures, apparatus and methods.

FIG. 3B illustrates a side cross-sectional view of the assembled components of FIG. 3A, showing mandrel 130 contacting indium-based material 104 prior to compression and heating. FIG. 3C illustrates a temporary compressive force (e.g., clamping force that is less than or equal to 5 psi, alternatively that is from 1 psi to 10 psi, further alternatively that is from 1 psi to 5 psi, or other suitable greater or lesser compressive force) applied in the direction of the arrows to compress indium foil between mandrel 130 and heat sink 102. At the same time, heat is also applied to the assembly of FIG. 3C to raise the temperature of the indium-based material 104 to a temperature at or above its melting point, so as to allow the mandrel 130 to displace the now liquid indium-based material. This is illustrated in FIG. 3C, where displaced indium material flows into the mandrel openings 132 to form protrusions or bumps 122 that extend outward (e.g., upward) from the now-compressed surface 105 of indium-based material 104, e.g., by a height of 0.020 inch to 0.040 inch above surface 105). In one embodiment, the indium-based material 104 may behave in a thixotropic manner when liquefied so that it only flows in areas where shear or stress is applied so as to limit undesired flow of the liquefied material 104 into areas of the assembly where it is not subjected to shear due to the applied compressive force.

Heat may be applied to the assembly of FIG. 3C using any suitable technique, e.g., such as an oven, hotplate, infrared (IR) lamp, etc. In one embodiment, when indium-based material 104 is heated to a liquid and then allowed to cool and solidify as described above, it may become mechanically adhered and thermally coupled (in the absence of soldering and in the absence of any other adhesive or chemical bonding) to upper surface 105 of heat sink 102 to a sufficient extent that indium-based material 104 does not separate from heat sink 102 when the temporary clamping force is released and lower surface 134 of mandrel 130 (with its mold release agent) is removed from contact with indium-based material 104. While not wishing to be bound by theory, it is believed that the liquefied indium-based material makes intimate contact with and infiltrates into and/or otherwise conforms to surface features (e.g., surface roughness and/or micro-pores) present in or on the adjoining surfaces and then solidifies in contact with these surface features in a manner that mechanically adheres the indium-based material to the adjoining surfaces without the presence of solder or other adhesive or chemical bonding. In one embodiment, the nature of this mechanical adherence is sufficiently strong to hold the indium-based material together with the adjoining surfaces with good thermal conductivity, but sufficiently weak enough to allow the surfaces to be pulled apart and separated without little or no damage to the separate component parts. This advantageously allows the components to be separated from the indium-based material without damage for inspection and/or repair.

Figure 3D:
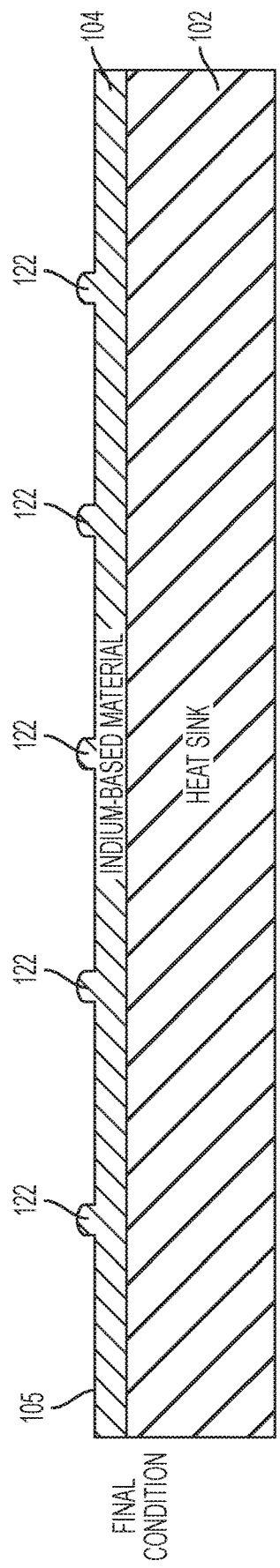
FIG. 3D illustrates a front cross-sectional view of a mandrel, heat sink, and indium-based material according to one exemplary embodiment of the disclosed structures, apparatus and methods.
Figure 4:
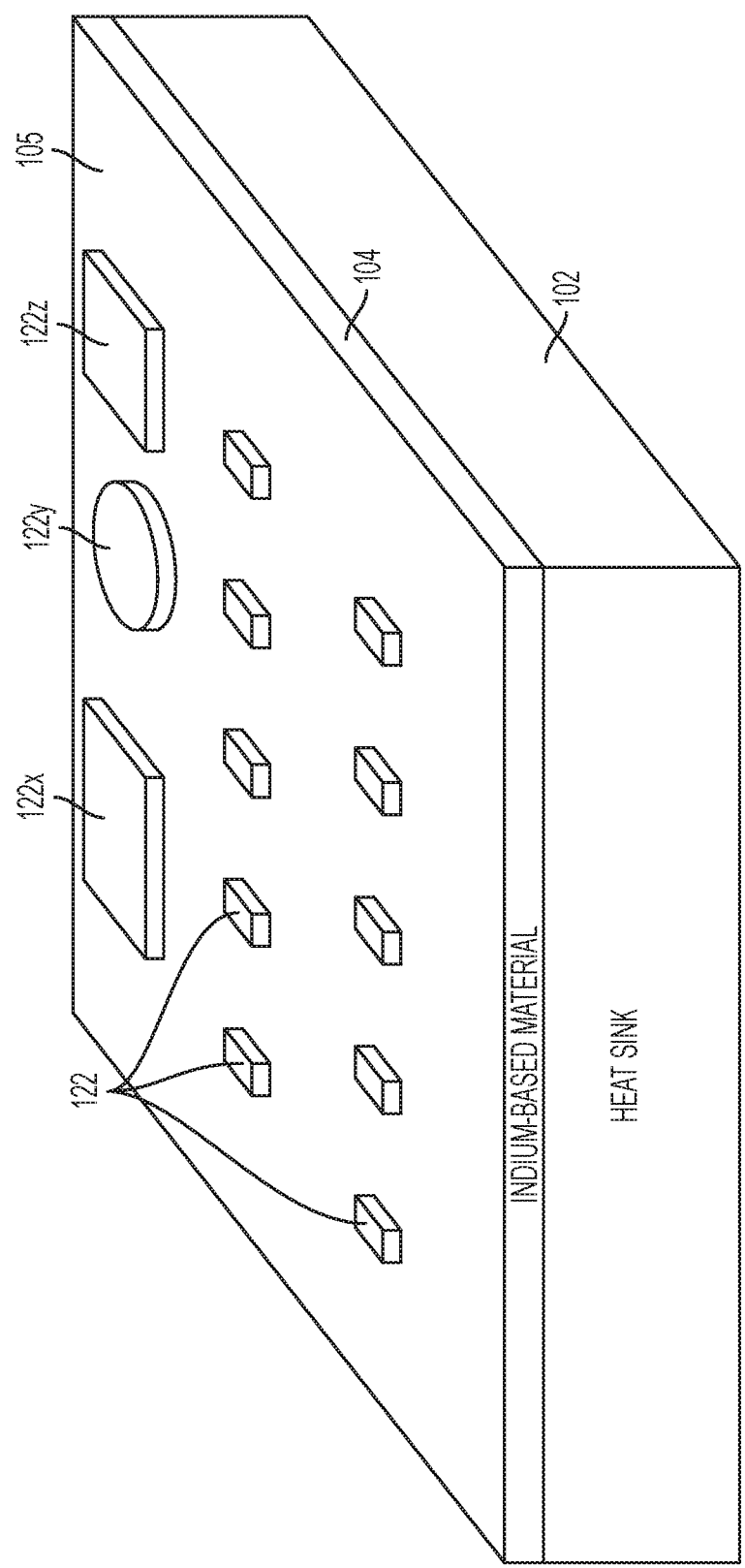
FIG. 4 illustrates an overhead perspective view of a heat sink and indium-based material according to one exemplary embodiment of the disclosed structures, apparatus and methods.

FIGS. 3D and 4 illustrate the formed bumps 122 after heating has been stopped, temperature of the indium-based material 104 has been allowed to cool to a temperature below its melting point and solidify, temporary clamping forced removed, and mandrel 130 has been raised or otherwise removed from contact with indium-based material 104 to leave indium-based material 104 adhered to the upper surface 103 of heat sink 102. FIG. 4 also illustrates bumps 122x, 122y and 122z of different shapes and sizes as they may be formed at a selected location simultaneously with other regularly-patterned bumps 122, i.e., by providing correspondingly dimensioned openings 132, 132x, 132y and 132z defined in lower surface 134 of mandrel 130. Thus, bumps of differing size, shape and location may be formed to match mating locations of mating heat-emitting components to be assembled to the heat sink 102 and the intervening indium-based material. In one embodiment, optional mold release agent previously described, may facilitate separation of the mandrel surface from the upper surfaces of then indium-based material 104, while the indium-based material remains adhered to and in non-soldered thermally-conductive contact with the upper surface 103 of heat sink 102. In the illustrated embodiment, the locations of bumps 122 correspond to electronic part locations, i.e., the pattern of bumps 122 correspond to a layout of individual electronic parts to be next assembled to the heat sink 102 with the indium-based material 104 therebetween as shown in FIGS. 5A-5C.

Figure 5A:
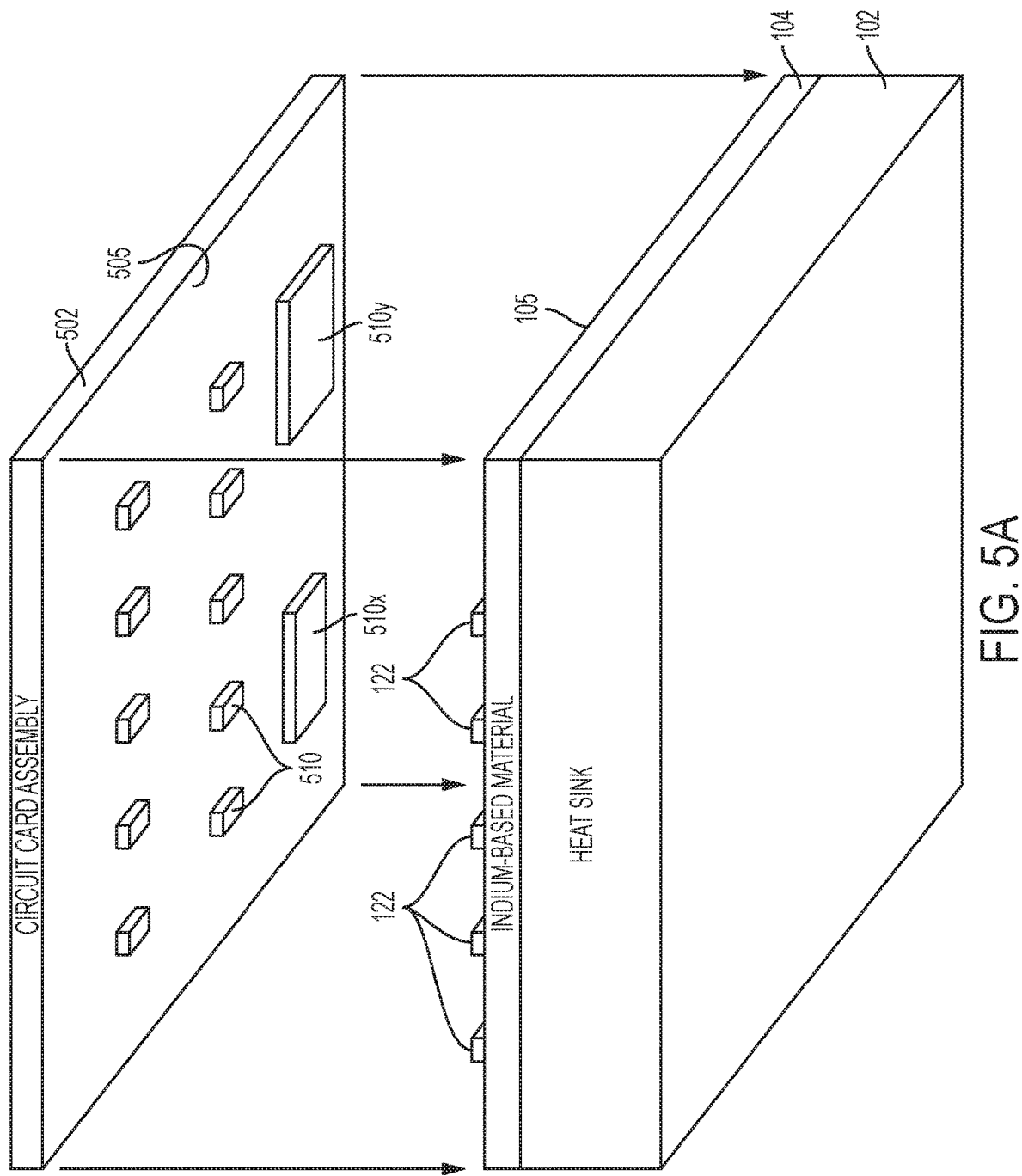
FIG. 5A illustrates an underneath perspective view of a circuit card assembly, heat sink and indium-based material according to one exemplary embodiment of the disclosed structures, apparatus and methods.

FIG. 5A illustrates an underside perspective view of circuit card assembly 502 (e.g., a printed circuit board "PCB" such as FR-4 fiberglass-epoxy board or other suitable circuit card substrate with electrically conductive circuit tracks) having multiple electronic components 510 (e.g., integrated circuit semiconductor chips such as processors, FPGAs, amplifiers, etc. and/or discrete circuits such as resistors, transistors, etc.) mounted on a planar surface 505 thereof. It will be understood that a circuit card assembly may include one or more electronic components, the number and mounting locations of which may be selected or dictated by the needs and characteristics of a given electronics application. Examples of such circuit card assemblies include, but are not limited to, multi-chip modules.

As shown in FIG. 5A, electronic components 510 may be electrically coupled to conductive circuitry tracks of circuit card in any suitable manner, e.g., such as surface mount metal tabs, flip chip solder balls, etc.). In FIG. 5A, circuit card assembly 502 is positioned over heat sink 102 and upper surface 105 of indium-based material 104 with electronic components 510 aligned for assembly to bumps 122, respectively, as described further herein. As shown in FIG. 5A, one or more electronic components 510x and 510y may be of differing size and shape than other components 510 that are present on circuit card assembly 502, and corresponds to the location, shape and size of bumps 122x, 122y and 122z as illustrated in FIG. 4. In this example, a single bump 122x is provided in position to mate with electronic component 510x when the components are assembled in FIG. 5A, while two separate bumps 122y and 122z are positioned to mate with separate portions (e.g., hot spots) of a single larger electronic component 510y when the components are assembled in FIG. 5A.

FIG. 5B illustrates circuit card assembly 502 brought together with heat sink 102 and indium-based material 104 such that individual electronic components 510 align with and contact upper surfaces of respective bumps 122. In FIG. 5C, a downward temporary compressive force (e.g., clamping force that is less than or equal to 5 psi, alternatively that is from 1 psi to 10 psi, further alternatively that is from 1 psi to 5 psi, or other suitable greater or lesser compressive force) has been applied to circuit card assembly 502 to cause bumps 122 to compress against the surface of electronic components 510 as shown by the arrows in FIG. 5C. Heat is applied along with the compressive force to raise the temperature of the indium-based material 104 to a temperature at or above its melting point and to allow the components 510 to displace the liquid Indium-based material. As shown in FIG. 5C, the displaced indium-based material flows away from the components 510, but this flow is limited and controlled by the initial bump 122 formation and the downward force of gravity toward the bottom of the page in FIG. 5C. This causes bumps 122 to reflow and flatten against the surface of electronic components 510 to form raised thermal interface contacts 512 as shown in FIG. 5C.

In one embodiment, melting point of indium-based material may be selected to be greater than the anticipated operating temperature of electronic components 510 (e.g., 125° C.) but below the melting point temperature of solder that is employed for circuitry and bonding of electronic components 510 and substrate of circuit card assembly 501. For example, heating may be applied to limit the temperature of indium-based material within a range greater than or equal to the melting point of the indium-based material (e.g., 158° C. melting point for pure indium) and below the melting point temperature of solder (e.g., 182° C. melting point for eutectic tin-lead solder) employed for circuitry or connections of components of 510 and circuit card substrate.

Next, the indium-based material 104 is allowed to cool and solidify with each bump 122 mechanically adhered and thermally coupled without soldering or chemical bonding to its corresponding electronic component 510. The temporary clamping force is also removed to form a zero stress or near zero stress completed assembly between indium-based material 104 and each of heat sink 102 and components 510 of circuit card assembly 502 which remain adhered together without application of any external or otherwise permanent compressive force. In the completed condition of FIG. 5C, the solidified indium-based material 104 forms a TIM structure that transfers heat from the electronic components 510 through non-soldered raised interface contacts 512 and the body of indium-based material 104 to heat sink 102 with a gap 590 (e.g., 0.005 inch to 0.020 inch) existing between the circuit card substrate surface 505 and the surface 105 of indium based material 104. In one embodiment, formation of raised thermal interface contacts 512 from bumps 122 may advantageously provide a greater degree of control over where the indium-based material 104 makes contact with individual electronic components 510, e.g., to prevent shorting through conductive indium-based material to adjacent components.

Figure 6:
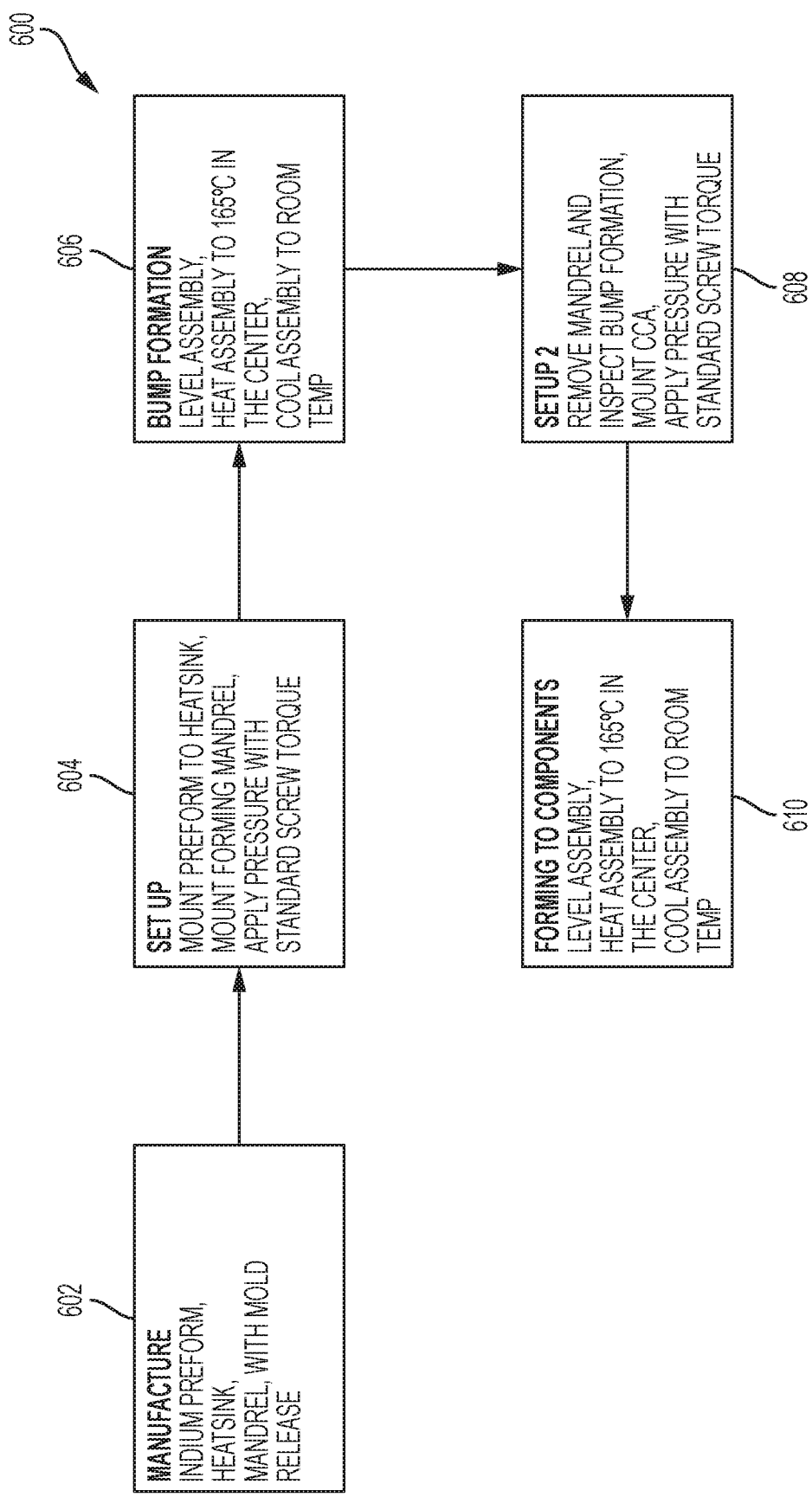
FIG. 6 illustrates methodology according to one exemplary embodiment of the disclosed structures, apparatus and methods.

FIG. 6 illustrates one exemplary embodiment of methodology 600 that may be employed to form a completed assembly of indium-based TIM interface between heat-emitting components of a circuit card assembly and a heat sink such as illustrated in FIG. 5D. Although described in relation to the previous figures herein, it will be understood that methodology 600 may be employed to form a solid indium-based interface between other types of surfaces. Methodology 600 starts in step 602 where indium-based material preform 104, heatsink 102, mandrel 130 and optional mold release agent are manufactured or otherwise procured. In setup step 604, indium-based material preform 104 is mounted to the upper surface 103 of heat sink 102. Mandrel 130 is then mounted to the indium-based material preform 104 such that lower surface 134 of mandrel 130 (with optional mold release agent) contacts upper surface 105 of indium-based material preform 104 as shown in FIGS. 3A and 3B. Temporary compressive force (e.g., clamping force that is less than or equal to 5 psi, alternatively that is from 1 psi to 10 psi, further alternatively that is from 1 psi to 5 psi, or other suitable greater or lesser compressive force) is then applied on indium-based material preform 104 between mandrel 130 and heat sink 102, e.g., with standard screw torque or using other suitable technique for applying temporary compressive force.

Next, in bump formation step 606, the assembly of mandrel 130, indium-based material preform 104 and heat sink 102 is leveled, e.g., to be horizontal or substantially horizontal relative to the force of gravity, e.g. so as to minimize uneven distribution or slumping of the self-leveling indium-based material preform material 104 when heated at or above its melting point. Heat is also applied in step 606 simultaneous with the compressive force of step 604 to raise the temperature of the indium-based material preform 104 at its center to a temperature (e.g., 165° C.) above its melting point and cause formation of bumps 122 as shown in FIG. 3C. In one exemplary embodiment, heat may be applied uniformly to the assembly such as from the mandrel side of the assembly as shown in FIG. 3C, or using any other heating technique. After formation of bumps in step 606, then heat is removed to allow indium-based material 104 to cool below its melting point, e.g., cooled to room temperature, and the temporary compressive force removed.

Next, in second setup step 608, mandrel 130 is separated and removed from indium-based material 104 as shown in FIG. 3D, and now-formed bumps 122 optionally inspected for complete formation, clean shape, etc. At this time, circuit card assembly 502 with its electronic components 510 aligned and mounted by contact with indium-based material 104 and its respective bumps 122 as shown in FIGS. 5A and 5B. As also shown in FIG. 5B, temporary compressive force (e.g., clamping force that is less than or equal to 5 psi, alternatively that is from 1 psi to 10 psi, further alternatively that is from 1 psi to 5 psi, or other suitable greater or lesser compressive force) is also applied at this time, e.g., with standard screw torque or using other suitable technique for applying temporary compressive force on indium-based material 104 between circuit card assembly 502 and heat sink 102.

Finally, in forming step 610, the assembly of circuit card assembly 502, indium-based material 104 with its bumps 510, and heat sink 102 is leveled, e.g., to be horizontal or substantially horizontal relative to the force of gravity. Heat is then applied in step 610 simultaneous with the compressive force to raise the temperature of the indium material 104 with its bumps 510 to a temperature (e.g., 165° C.) above its melting point to cause bumps 510 to reflow to form completed raised interface contacts 512 as shown in FIG. 5C. As before, heat may be applied uniformly to the assembly such as from the mandrel side of the assembly as shown in FIG. 3C, or using any other suitable heating technique. After bump reflow, the assembly of FIG. 5C is then allowed to cool below the melting point of the indium-based material, and the temporary compressive force removed, to form a completed assembly that includes a TIM structure that transfers heat from the electronic components 510 through raised interface contacts 512 and the body of indium-based material 104 to heat sink 102 without application of any external or otherwise permanent compressive force.

It will be understood that methodology 600 is exemplary only, and that any other combination of reordered, additional, alternative, and/or fewer steps may be employed to form an indium-based interface material.

Figure 7A:
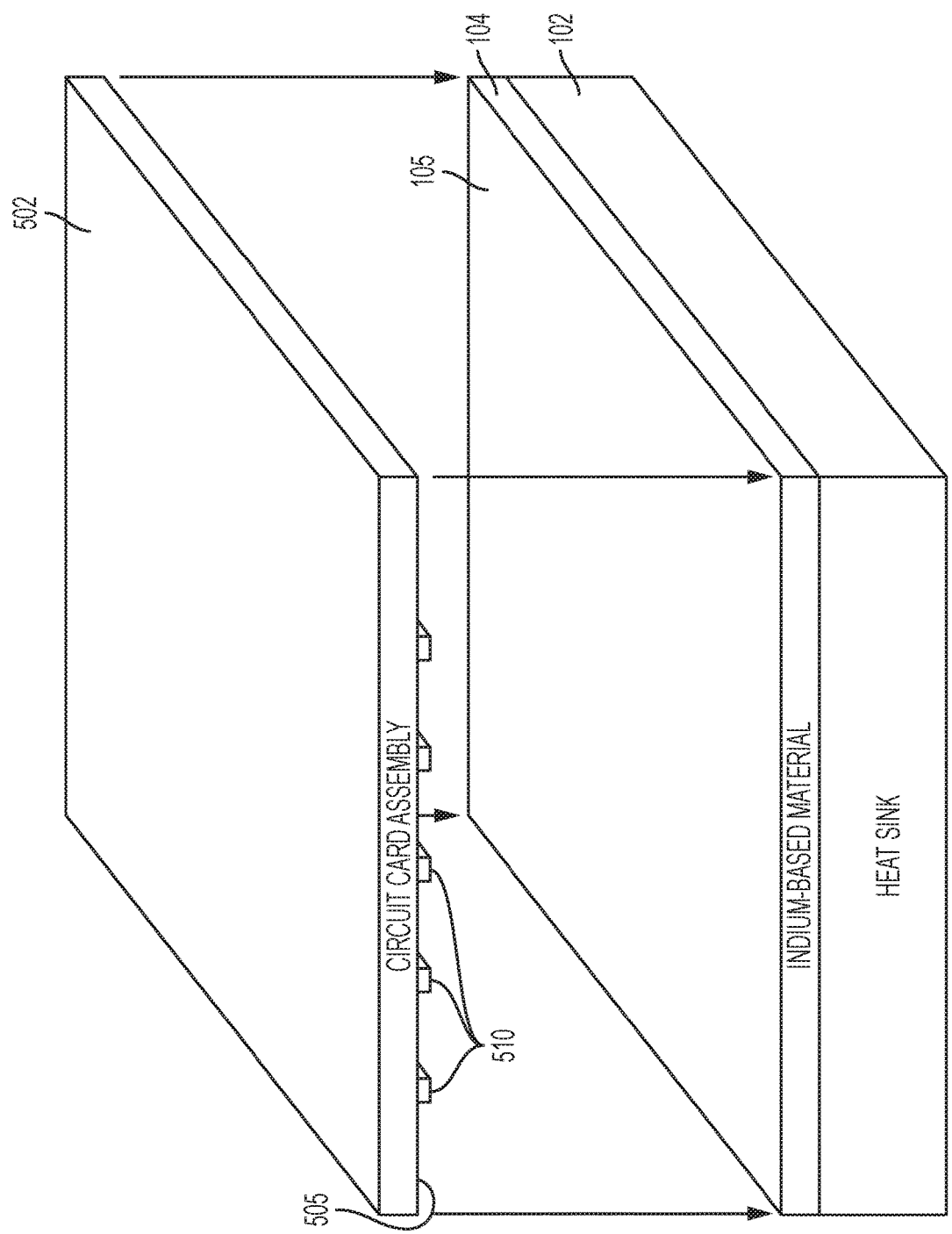
FIG. 7A illustrates an overhead perspective view of a circuit card assembly, heat sink, and indium-based material according to one exemplary embodiment of the disclosed structures, apparatus and methods.
Figure 7B:
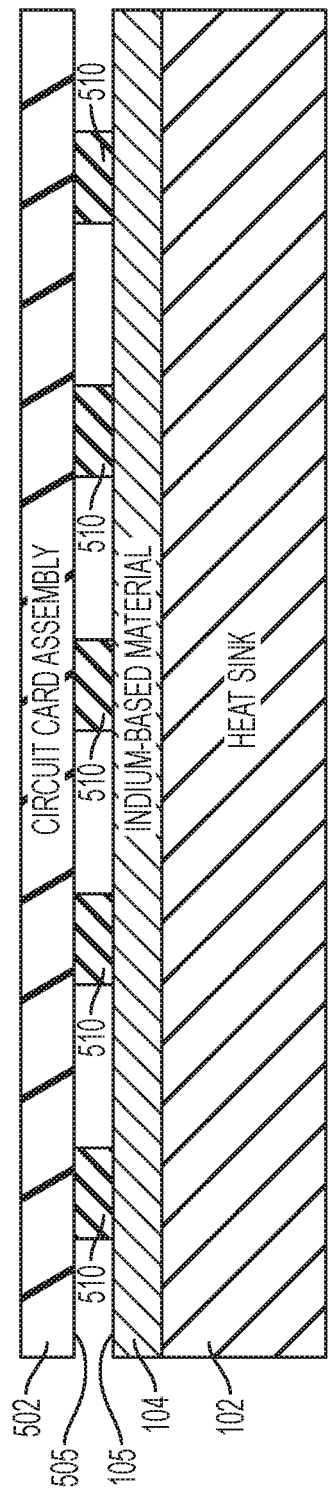
FIG. 7B illustrates a front cross-sectional view of a circuit card assembly, heat sink, and indium-based material according to one exemplary embodiment of the disclosed structures, apparatus and methods.
Figure 7C:
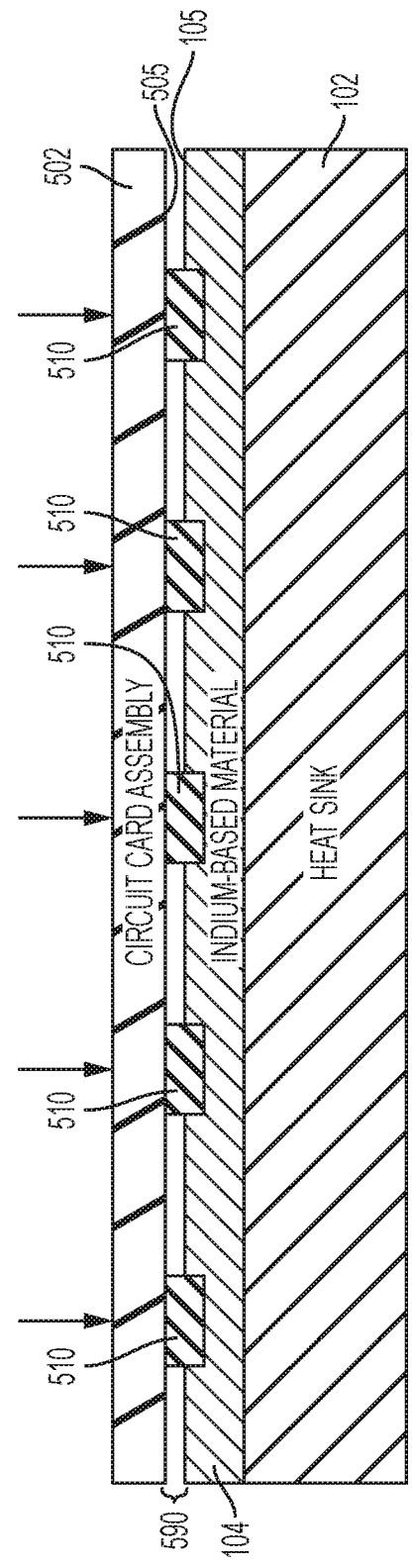
FIG. 7C illustrates a front cross-sectional view of a circuit card assembly, heat sink, and indium-based material according to one exemplary embodiment of the disclosed structures, apparatus and methods.

FIGS. 7A to 7C illustrate one example of an alternative embodiment that may be employed to form an indium-based TIM interface structure without the use of a mandrel and bump-forming process, i.e., by displacing electronic components 510 directly into the planar upper surface 105 of a liquefied indium-based material preform 104. In this alternative embodiment, an indium-based material preform 104 may be mounted to a heat sink 102 in place to receive a circuit card assembly 502 as shown in FIG. 7A. The circuit card assembly 502 may then be aligned and brought together with its electronic components 510 in contact with the planar upper surface 105 of indium-based material preform 104 as shown in FIG. 7B. Heat and temporary compressive force (e.g., clamping force that is less than or equal to 5 psi, alternatively that is from 1 psi to 10 psi, further alternatively that is from 1 psi to 5 psi, or other suitable greater or lesser compressive force) may then be applied as shown in FIG. 7C in similar manner as described in relation to FIG. 3C and step 610 of FIG. 6. When indium-based material preform 104 of FIG. 7C is heated at its center above its melting point (e.g., 165° C.), it liquefies to allow components 510 to displace downward into the surface 105 of indium-based material 104 as shown, e.g., by a distance of from 0.005 inch to 0.020 inch, or other suitable greater or lesser distance. Although in some cases some upward flow around the sides of components 105 may occur, in one embodiment the thixotropic nature of the liquefied indium-based material 104 may help limit undesired flow of the material 104 into areas up and around the sides of components 510.

Heat may then be removed, the assembly allowed to cool as before to mechanically adhere and thermally couple (without soldering or chemical bonding) the indium-based material to each of the heat sink 102 and the contacted surface of electronic components to form the completed assembly that includes a TIM structure that transfers heat from the electronic components 510 through the body of indium-based material 104 to heat sink 102. The temporary clamping force is also removed to form a zero stress or near zero stress completed assembly between indium-based material 104 and each of heat sink 102 and components 510 of circuit card assembly 502 which remain adhered together without application of any external or otherwise permanent compressive force.

Figure 8B:
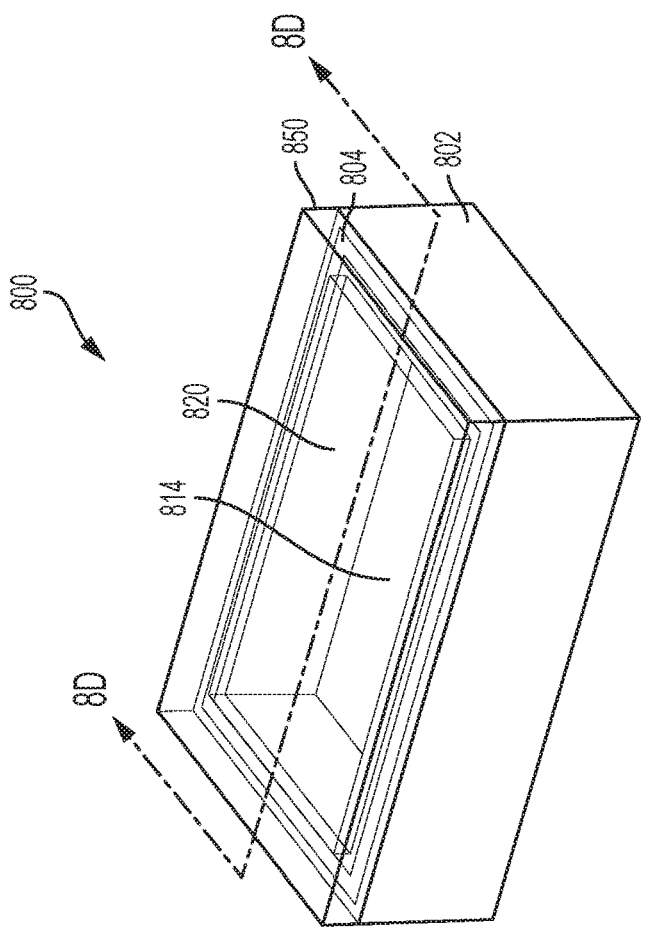
FIG. 8B illustrates an overhead perspective view of container components and indium-based material according to one exemplary embodiment of the disclosed structures, apparatus and methods.
Figure 8A:
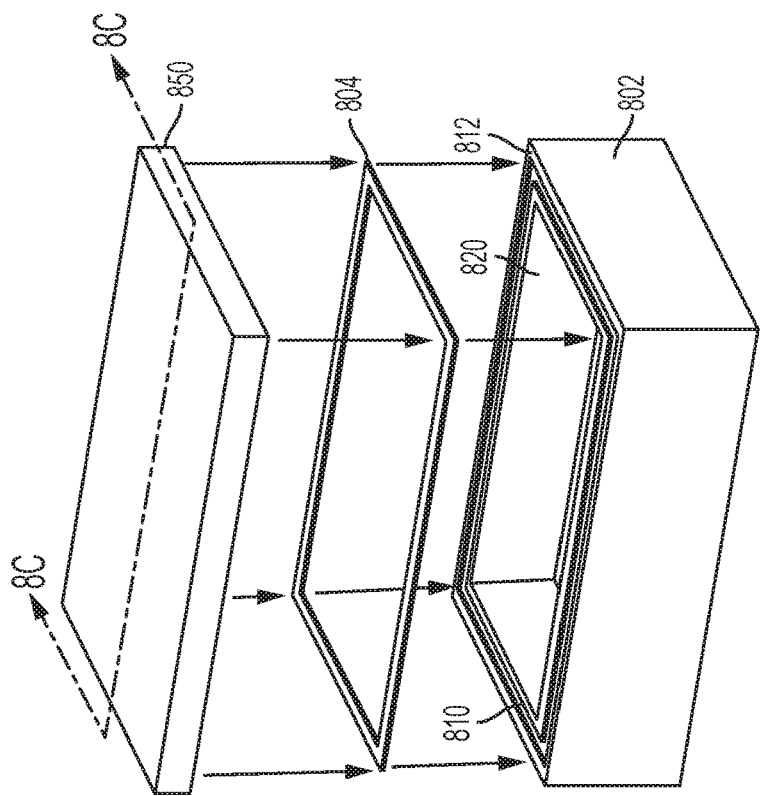
FIG. 8A illustrates an overhead perspective view of container components and indium-based material according to one exemplary embodiment of the disclosed structures, apparatus and methods.
Figure 8C:
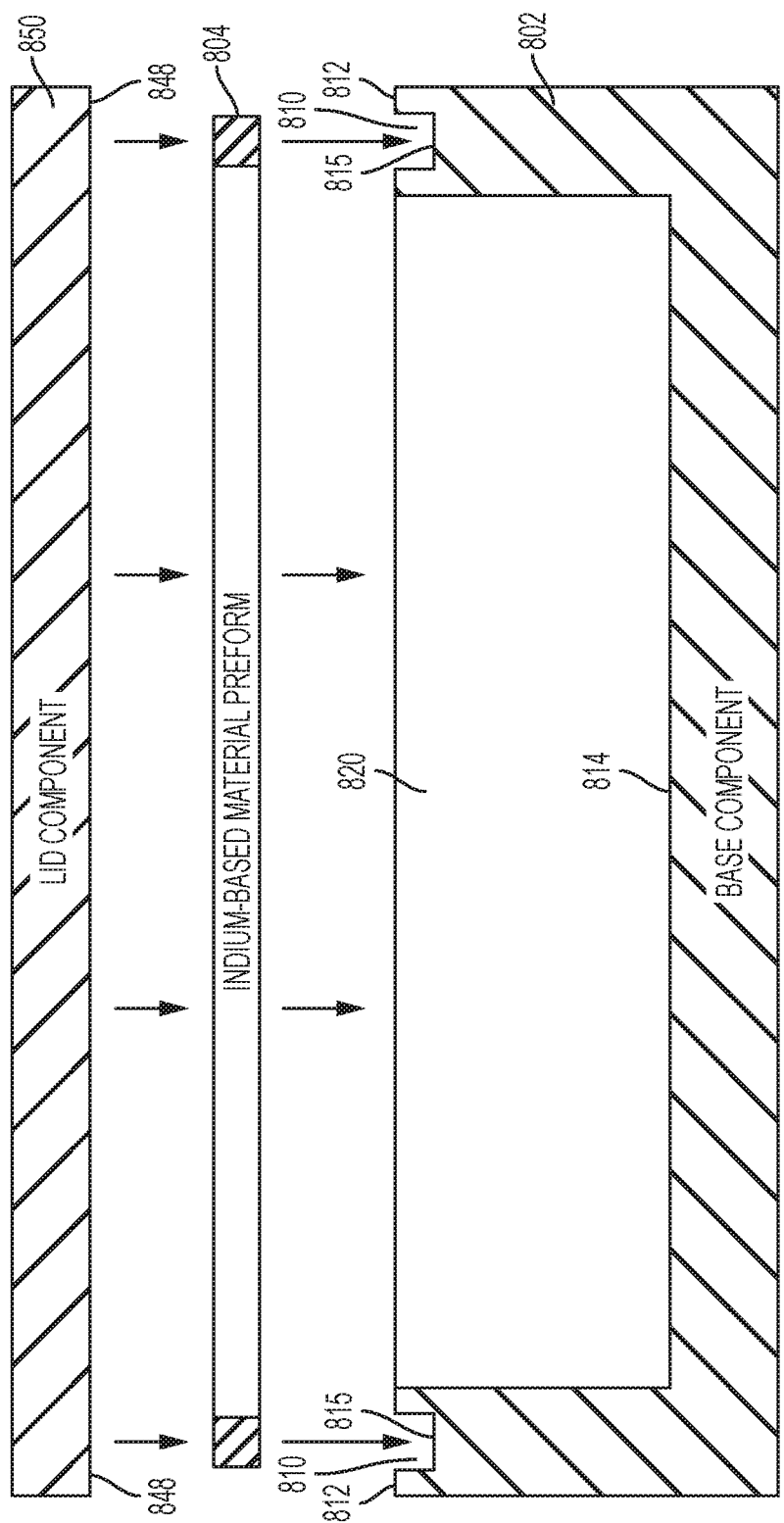
FIG. 8C illustrates a front cross-sectional view of container components and indium-based material according to one exemplary embodiment of the disclosed structures, apparatus and methods.
Figure 8D:
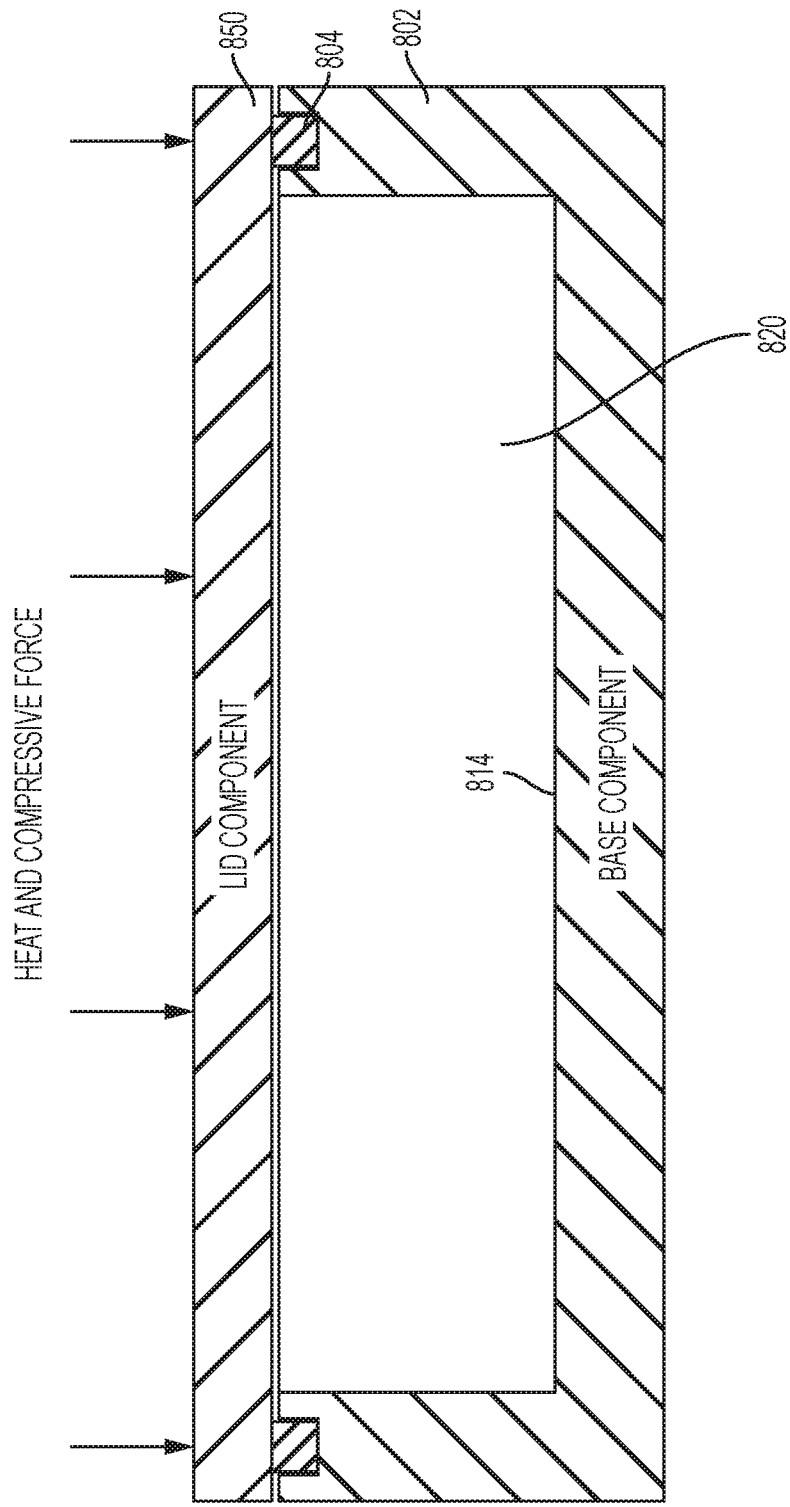
FIG. 8D illustrates a front cross-sectional view of container components and indium-based material according to one exemplary embodiment of the disclosed structures, apparatus and methods.

It will be understood that an indium-based interface may be formed between other types of surfaces, including for example a non-TIM type interface. For example, FIGS. 8A to 8D illustrate views of an exemplary embodiment in which an electromagnetic interference (EMI)-seal and/or hermetically sealed enclosure 800 may be formed from separate container components 850 and 802. As shown in frontal perspective view of FIG. 8A and front cross-sectional view of FIG. 8C, a base component 802 of enclosure 800 may be aligned with a lid component 850 of the enclosure with a peripheral indium-based material preform 804 therebetween before bringing these components together in sealed relationship as shown in in frontal perspective view of FIG. 8B and front cross-sectional view of FIG. 8C. In the illustrated embodiment, base component 802 is configured as a container having an interior cavity 820 with an open top surface 812 and closed bottom surface 814. An optional gland 810 may be provided as a peripheral recess defined within the upper peripheral top surface 812 of the base component 802 for receiving the indium based preform 804 as shown in perspective view of FIG. 8B and cross-sectional view of FIG. 8D prior to heating. As shown in FIG. 8D, temporary compressive force (e.g., clamping force that is less than or equal to 5 psi, alternatively that is from 1 psi to 10 psi, further alternatively that is from 1 psi to 5 psi, or other suitable greater or lesser compressive force) may be applied to the assembled components while the assembled components are heated to a temperature greater than the melting point of the indium based preform material 804 to cause the indium-based material to liquefy and conform to the shape of the contacting surfaces of gland 810 within base component 802 and the underside surface of lid component 850. Once cooled below the melting point of the indium-based material and temporary compressive force removed as previously described for other embodiments, the indium-based material 804 becomes mechanically adhered (without soldering or chemical bonding) to the inner contacting surfaces 815 of gland 810 of base component 802 and to underside surface 848 of lid component 850 to form an EMI and/or hermetic seal between base component 802 and lid component 850 with the cavity 820 sealed therebetween. No external or otherwise permanent compressive force is required to maintain a zero stress or near zero stress completed sealed assembly between the lid component 850 and the base component 802. A gap may or may not exist between the surfaces 848 and 812 in the completed sealed assembly. Example applications for an EMI and/or hermetically sealed container include, but are not limited to, packaging and protection of bare die (wire bonded or flip chip), packaged monolithic microwave integrated circuits (MMICs), RF components, or any component sensitive to EMI or environmental effects, etc.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems, structures, and methods may be utilized in various combinations and/or independently. Thus the invention is not limited to only those combinations shown herein, but rather may include other combinations.

What is claimed is:

1. A method, comprising forming a solid indium-based interface between a first surface and a second surface by:
   first positioning a first side of an indium-based material in contact with the first surface while heating the indium-based material above the melting point of the indium-based material, and forming at least one bump on an opposing second side of the indium-based material, the bump having an outer surface that extends outward and away from the second side of the indium-based material;
   then maintaining the indium-based material in contact with the first surface while allowing the indium-based material to cool below the melting point of the indium-based material;
   then positioning the outer surface of the bump in contact with the second surface while again heating the indium-based material above the melting point of the indium-based material to melt the bump into a raised contact having an outer surface that extends outward and away from the second side of the indium-based material in contact with the second surface; and
   then maintaining the second surface in contact with the outer surface of the raised contact while allowing the indium-based material to cool below the melting point of the indium-based material to form a solid indium-based interface that is mechanically adhered without the presence of solder to the first surface and to the second surface with a height of the raised contact forming a gap between the second surface and the second side of the indium-based material.

2. The method of claim 1, where the first surface comprises a heat sink; and where the second surface comprises an external surface of at least one heat-emitting component.

3. The method of claim 1, where the step of forming at least one bump on an opposing second side of the indium-based material further comprises;
   positioning the second side of the indium-based material in contact with a mandrel surface that has at least one opening defined therein while the first side of the indium-based material is positioned in contact with the first surface and while heating the indium-based material above the melting point of the indium-based material to cause the indium material to flow into the mandrel opening to form the bump on the second side of the indium-based material;
   then maintaining the second side of the indium-based material in contact with the mandrel surface while allowing the indium-based material to cool below the melting point of the indium-based material to solidify the bump on the second side of the indium-based material; and
   then separating the mandrel surface from contact with the second side of the indium-based material while the first side of the indium-based material remains in contact with the first surface.

4. The method of claim 3, where the first surface comprises a heat sink; where the second surface comprises separate external surfaces of multiple electronic components that are mounted to a substrate at given locations; where the step of forming at least one bump on the opposing second side of the indium-based material further comprises forming multiple bumps disposed on the opposing second side of the indium-based material at mating locations to the given locations of the multiple electronic components; and where the method further comprises:

then positioning the outer surfaces of the multiple bumps in contact with corresponding external surfaces of the multiple electronic components while again heating the indium-based material above the melting point of the indium-based material to melt each of the bumps into a raised contact having an outer surface that extends outward and away from the second side of the indium-based material in contact with at least one corresponding external surface of one of the electronic components; and then maintaining the outer surfaces of the multiple raised contacts in contact with corresponding external surfaces of the multiple electronic components while allowing the indium-based material to cool below the melting point of the indium-based material to form a solid indium-based thermal interface material (TIM) adhered to and thermally coupled between the heat sink and the multiple electronic components with a height of the raised contacts forming a first gap between the external surfaces of the multiple electronic components and the second side of the indium-based material, and with a second gap formed between the substrate and the second side of the indium-based material.

5. The method of claim 4, where the melting point of the indium-based material is from greater than or equal to 125° C. to less than 230° C.

6. The method of claim 4, further comprising applying a compressive force of from 1 psi to 10 psi between the indium-based material and each of the first surface and the second surfaces while heating the indium-based material above the melting point of the indium-based material and allowing the indium-based material to cool below the melting point of the indium-based material to form a solid indium-based interface; and releasing the compressive force after the indium-based material has cooled below the melting point of the indium-based material to form the solid indium-based thermal interface material (TIM) to have an effective bulk linear thermal conductivity of from 16 W/m-K to 86 W/m-K in the absence of applied compressive force between the indium-based material and each of the first surface and the second surfaces.

7. The method of claim 1, where the indium-based material is indium.

8. A method, comprising forming a solid indium-based interface between a first surface and a second surface by:

first positioning a first side of an indium-based material in contact with the first surface while heating the indium-based material above the melting point of the indium-based material, and forming at least one bump on an opposing second side of the indium-based material, the bump having an outer surface that extends outward and away from the second side of the indium-based material;

then maintaining the indium-based material in contact with the first surface while allowing the indium-based material to cool below the melting point of the indium-based material;

then positioning the outer surface of the bump in contact with the second surface while again heating the indium-based material above the melting point of the indium-based material to melt the bump into a raised contact having an outer surface that extends outward and away from the second side of the indium-based material in contact with the second surface; and then maintaining the second surface in contact with the outer surface of the raised contact while allowing the indium-based material to cool below the melting point of the indium-based material to form a solid indium-based interface that is mechanically adhered without the presence of solder, adhesive, or chemical bonding to the first surface and to the second surface with a height of the raised contact forming a gap between the second surface and the second side of the indium-based material.

\* \* \* \* \*